(12) United States Patent
Sakura

(10) Patent No.: US 8,884,208 B2
(45) Date of Patent: Nov. 11, 2014

(54) LIGHT RECEIVING CIRCUIT

(75) Inventor: Shigeyuki Sakura, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 271 days.

(21) Appl. No.: 13/423,780

(22) Filed: Mar. 19, 2012

(65) Prior Publication Data

US 2013/0068935 A1 Mar. 21, 2013

(30) Foreign Application Priority Data

Sep. 15, 2011 (JP) ................................. 2011-202034

(51) Int. Cl.
- H01J 40/14 (2006.01)
- G01J 1/44 (2006.01)
- H03G 3/30 (2006.01)
- H03F 3/08 (2006.01)

(52) U.S. Cl.
CPC ............... G01J 1/44 (2013.01); H03G 3/3084 (2013.01); H03F 3/082 (2013.01)
USPC ............ 250/214 A; 250/214 R; 250/214 LA; 330/308

(58) Field of Classification Search
CPC ....... H03F 3/082; H03F 3/087; H03G 1/0029; H03G 3/3084
USPC ....... 250/206, 214 A, 214 LA, 214 R, 214 C; 330/59, 110, 260, 287, 308; 398/209, 398/213
See application file for complete search history.

(56) References Cited

U.S. PATENT DOCUMENTS

| 6,046,461 A | 4/2000 | Saitoh et al. |
| 7,265,632 B2* | 9/2007 | Kwa et al. ............ 330/308 |
| 7,971,090 B2 | 6/2011 | Nan |
| 2007/0109056 A1 | 5/2007 | Kwa et al. |
| 2007/0126507 A1* | 6/2007 | Sakura ............. 330/254 |

FOREIGN PATENT DOCUMENTS

| JP | 61-206303 A | 9/1986 |
| JP | 04-356805 A | 12/1992 |
| JP | 06-152266 A | 5/1994 |
| JP | 09-049762 A | 2/1997 |
| JP | 09-321548 A | 12/1997 |
| JP | 2003-051723 A | 2/2003 |

(Continued)

OTHER PUBLICATIONS

Background Art Information Sheet provided by Applicants, Nov. 24, 2011 (1 page total).

(Continued)

*Primary Examiner* — Kevin Pyo
(74) *Attorney, Agent, or Firm* — Posz Law Group, PLC

(57) ABSTRACT

According to one embodiment, a light receiving circuit having a trans-impedance amplifier and an output circuit is provided. The trans-impedance amplifier includes a photodiode, a feedback resistor and a first transistor having a channel of a first conductive type. The photodiode converts an optical signal into an electrical signal. Ends of the feedback resistor are connected respectively to the photodiode and a node. A gate of the first transistor receives the electrical signal from the photodiode. A signal corresponding to a signal from a drain of the first transistor is output to the node. The output circuit includes a second transistor having a channel of the first conductive type, and generates an output signal from a drain of the second transistor. A gate of the second transistor is connected to the node.

8 Claims, 6 Drawing Sheets

(56) References Cited

FOREIGN PATENT DOCUMENTS

| JP | 2003-139608 A | 5/2003 |
| JP | 2003-218645 A | 7/2003 |
| JP | 2003-318664 A | 11/2003 |
| JP | 2004-304708 A | 10/2004 |
| JP | 2007-005901 A | 1/2007 |
| JP | 2007-143162 A | 6/2007 |
| JP | 2008-167364 A | 7/2008 |
| JP | 2009-89059 A | 4/2009 |

OTHER PUBLICATIONS

Office Action mailed Feb. 12, 2014 in corresponding JP Application No. 2011-202034 (and English translation).
Office Action mailed May 30, 2014 issued in corresponding JP Patent Application No. 2011-202034 (and English translation).

* cited by examiner

US 8,884,208 B2

LIGHT RECEIVING CIRCUIT

CROSS-REFERENCE TO RELATED APPLICATION

This application is based upon and claims the benefit of priority from the prior Japanese Patent Application No. 2011-202034, filed on Sep. 15, 2011, the entire contents of which are incorporated herein by reference.

FIELD

Embodiments described herein relate generally to a light receiving circuit.

BACKGROUND

With progress of development of a complementary metal oxide semiconductor (CMOS) technology for electronic devices, low power consumption of electronic devices has been promoted rapidly. A light receiving circuit, which is used in a photocoupler or an optical transmission link employing an optical fiber, is provided with a trans-impedance amplifier that is an inverting amplifier, or a differential amplifier, as an amplifier. An electronic device is strongly requested to have a light receiving circuit with low power consumption.

A light receiving circuit is provide with a trans-impedance amplifier, a reference voltage generating circuit, a comparator comparing the outputs of the amplifier and the circuit, and an output circuit to output a signal from the comparator, for example. Due to such a circuitry configuration, it is difficult to achieve low power consumption of the light receiving circuit.

DETAILED DESCRIPTION

Figure 1:
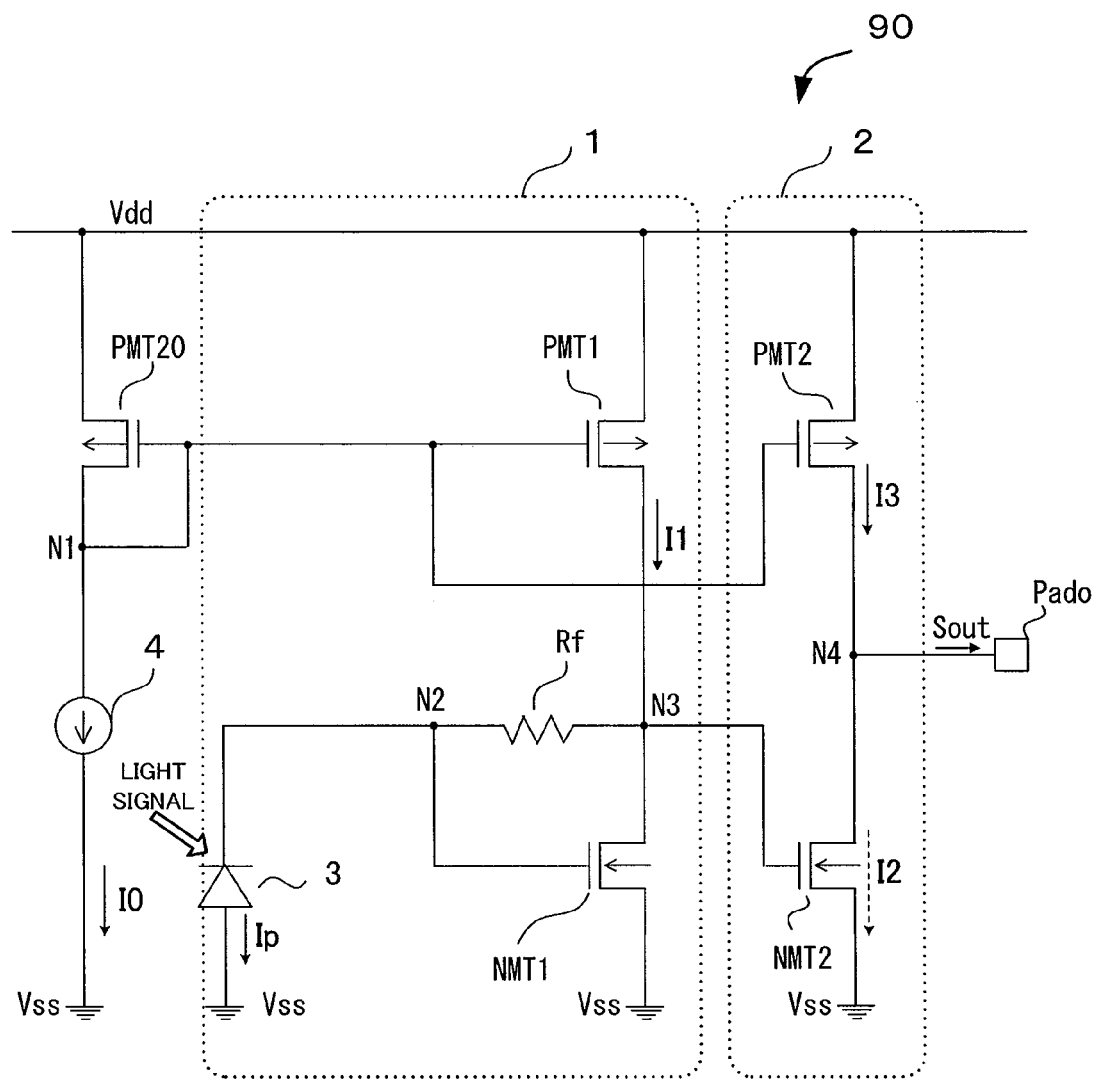
FIG. 1 is a circuit diagram illustrating a configuration of a light receiving circuit according to a first embodiment.

According to one embodiment, a light receiving circuit having a trans-impedance amplifier and an output circuit is provided. The trans-impedance amplifier includes a photodiode, a feedback resistor and a first transistor having a channel of a first conductive type. The photodiode converts an optical signal into an electrical signal. One end of the feedback resistor is connected to the photodiode. Another end of the feedback resistor is connected to a node. A gate of the first transistor receives the electrical signal. A signal corresponding to a signal from a drain of the first transistor is output to the node. The output circuit includes a second transistor having a channel of the first conductive type and generates an output signal from a drain of the second transistor. A gate of the second transistor is connected to the node.

Hereinafter, further embodiments will be described with reference to the drawings.

In the drawings, the same reference numerals denote the same or similar portions respectively.

Figure 2:
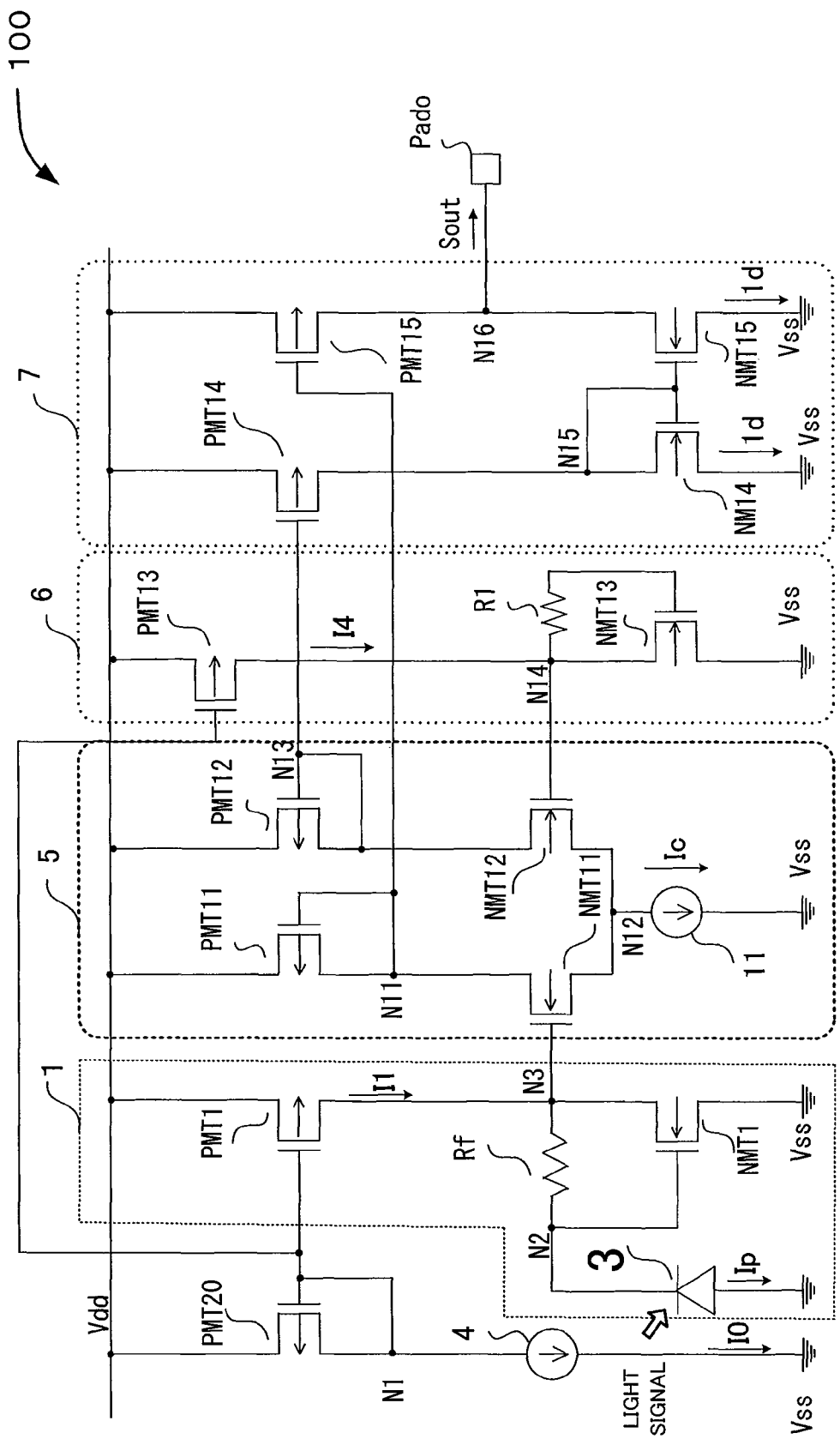
FIG. 2 is a circuit diagram illustrating a configuration of a light receiving circuit according to a comparative example.

FIG. 1 is a circuit diagram illustrating a configuration of a light receiving circuit according to a first embodiment. FIG. 2 is a circuit diagram illustrating a configuration of a light receiving circuit according to a comparative example.

As illustrated in FIG. 1, a light receiving circuit 90 is provided with a trans-impedance amplifier 1, an output circuit 2, a current source 4, a P-channel metal oxide semiconductor (MOS) transistor PMT20, and an output terminal Pado.

The light receiving circuit 90 is composed of a plurality of CMOS devices as will be described below, and may be used in a photocoupler as an optical coupling circuit, a light receiving device with an optical fiber link, etc. In the embodiment, a terminal of a MOS transistor on a side of a power supply line Vdd of a higher potential side which is used in the light receiving circuit 90 will be referred to as a first terminal, and a terminal of a MOS transistor on a side of a power supply line Vss of a lower potential (ground potential) side which is used in the light receiving circuit 90 will be referred to as a second terminal.

A source i.e. a first terminal of the P-channel MOS transistor PMT20 is connected to the power supply line Vdd. A gate i.e. a control terminal of the P-channel MOS transistor PMT20 is connected to a node N1 and a drain of the P-channel MOS transistor PMT20. One end of the current source 4 is connected to the node N1, and the other end of the current source 4 is connected to the power supply line Vss. The current source 4 causes a current I0 to flow to the side of the power supply line Vss.

The trans-impedance amplifier 1 is provided with a photodiode 3, a P-channel MOS transistor PMT1, an N-channel MOS transistor NMT1, and a feedback resistor Rf.

A source i.e. a first terminal of the P-channel MOS transistor PMT1 is connected to the power supply line Vdd, a gate i.e. a control terminal of the P-channel MOS transistor PMT1 is connected to the gate of the P-channel MOS transistor PMT20. A drain i.e. a second terminal of the P-channel MOS transistor PMT1 is connected to a node N3 i.e. an internal output terminal. The P-channel MOS transistor PMT20 and the P-channel MOS transistor PMT1 constitute a current mirror circuit which serves as a current source. The P-channel MOS transistor PMT1 functions as a current generating unit which generates a current I1 which flows to the node N3, in other words, from the source to the drain of the P-channel MOS transistor PMT1. The P-channel MOS transistor PMT1 functions as a current source load.

A cathode of the photodiode 3 is connected to a node N2, and an anode of the photodiode 3 is connected to the power supply line Vss. The photodiode 3 converts an optical signal into an electrical signal, and by the conversion, a current Ip flows to the power supply line Vss. The photodiode 3 is, for example, a silicon photodiode.

One end of the feedback resistor Rf is connected to the node N2 and the cathode of the photodiode 3, and the other end of the feedback resistor Rf is connected to the node N3 output the internal output terminal. A drain i.e. a first terminal of the N-channel MOS transistor NMT1 is connected to the node N3 i.e. the internal output terminal and the other terminal of the feedback resistor Rf. A gate i.e. the control terminal of the N-channel MOS transistor NMT1 is connected to the node N2 and the cathode of the photodiode 3. A source i.e. a second terminal of the N-channel MOS transistor NMT1 is connected to the power supply line Vss. The N-channel MOS transistor NMT1 transmits an output signal as an output of the trans-impedance amplifier 1, from the drain i.e. the node N3 to the output circuit 2.

The output circuit 2 includes a P-channel MOS transistor PMT2 and an N-channel MOS transistor NMT2.

A source i.e. the first terminal of the P-channel MOS transistor PMT2 is connected to the power supply line Vdd. A gate i.e. a control terminal of the P-channel MOS transistor PMT2 is connected to the gate of the P-channel MOS transistor PMT20. A drain i.e. a second terminal of the P-channel MOS transistor PMT2 is connected to a node N4. The P-channel MOS transistor PMT20 and the P-channel MOS transistor PMT2 constitute a current mirror circuit which serves as a current source. The P-channel MOS transistor PMT2 functions as a current generating unit which generates a current I3 flowing to the node N4, from the source to the drain of the P-channel MOS transistor PMT2. The P-channel MOS transistor PMT2 functions as a current source load.

A drain i.e. a first terminal of the N-channel MOS transistor NMT2 is connected to the node N4. A gate i.e. a control terminal of the N-channel MOS transistor NMT2 is connected to the node N3 i.e. the internal output terminal. A source i.e. a second terminal of the N-channel MOS transistor NMT2 is connected to the power supply line Vss. A current I2 flows through the N-channel MOS transistor NMT2 to the power supply line Vss. The N-channel MOS transistor NMT2 outputs an output signal Sout from the drain i.e. the node N4 of the N-channel MOS transistor NMT2 to an output terminal Pado.

In the light receiving circuit 90, the currents I1, I3, a gate width W1/a gate length L1 respectively of the N-channel MOS transistor NMT1, and a gate width W2/a gate length L2 respectively of the N-channel MOS transistor NMT2 are set to suitable values so that the output signal Sout is switched when an optical signal is input to the photodiode 3.

When an optical signal is not input to the photodiode 3, the trans-impedance amplifier 1 and the output circuit 2 are set such that the current I3 is larger than the current I2 (I3>I2). In this case, since the P-channel MOS transistor PMT2 operates linearly, the P-channel MOS transistor PMT2 can be regarded as a resistor, and the output signal Sout becomes a "High" level. At this time, the current I2 flows through the drain of the P-channel MOS transistor PMT2.

When an optical signal is input to the photodiode 3, a voltage of the node N3 i.e. a voltage of the gate of the N-channel MOS transistor NMT2 increases, and the current I3 is smaller than the current I2 (I3<I2). In this case, since the N-channel MOS transistor NMT2 operates linearly, the N-channel MOS transistor NMT2 can be regarded as a resistor, and the output signal Sout becomes a "Low" level. At this time, the current I3 flows through the N-channel MOS transistor NMT2.

A current Is1, which flows through the light receiving circuit 90 when an optical signal is not input to the photodiode 3, is expressed as follows. In addition, a current Is2, which flows through the light receiving circuit 90 when an optical signal is input to the photodiode 3 to switch the output signal Sout, is expressed as follows.

$$Is1 = I0 + I1 + I2 \tag{11}$$

$$Is2 = I0 + I1 + I3 \tag{12}$$

A switching current Ipth obtained from an optical current Ip of the photodiode 3 will be described below.

Assuming a voltage of the node N2 is denoted by Vg, a threshold voltage of the N-channel MOS transistors NMT1 and NMT2 is denoted by $V_T$, a voltage of the node N3 is denoted by V1, a feedback resistance value is denoted by Rf, the gate width/the gate length respectively of the N-channel MOS transistor NMT1 is denoted by W1/L1, and a proportional multiplier is denoted by K', the voltage Vg can be expressed as follows.

$$V_g = V_T + \sqrt{\frac{2(I_1 - I_P)}{(W_1/L_1)K'}} \tag{1}$$

The voltage V1 can be expressed as follows.

$$V1 = Vg + (Ip \times Rf) \tag{13}$$

The current I2 can be expressed as follows.

$$I_2 = \left(\frac{1}{2}\right)(W_2/L_2)K'(V_1 - V_T)^2 \tag{2}$$

$$= \left(\frac{1}{2}\right)(W_2/L_2)K'\left(I_p R_f + \sqrt{\frac{2(I_1 - I_P)}{(W_1/L_1)K'}}\right)^2$$

Assuming the gate width/the gate length respectively of the N-channel MOS transistor NMT2 is denoted by W2/L2, and a threshold current Ipth is the current Ip when the current I2 is equal to the current I3, the threshold current Ipth can be expressed as follows.

$$I_{pTH} = \frac{\left(R_f\sqrt{\frac{2I_3}{(W_2/L_2)K'}} - \frac{1}{(W_1/L_1)K'}\right) - \sqrt{\frac{1}{(W_1/L_1)K'}\left(\frac{1}{(W_1/L_1)K'} + 2R_f^2 I_1 - 2R_f\sqrt{\frac{2I_3}{(W_2/L_2)K'}}\right)}}{R_f^2} \tag{3}$$

As illustrated in FIG. 2, a light receiving circuit 100 according to an comparative example is provided with a trans-impedance amplifier 1, a comparator 5, a reference voltage generating circuit 6, an output circuit 7, a current source 4, a P-channel MOS transistor PMT20, and an output terminal Pado. The trans-impedance amplifier 1, the current source 4, the P-channel MOS transistor PMT20, and the output terminal Pado of the light receiving circuit 100 are similar to those of the light receiving circuit 90 according to the first embodiment.

The reference voltage generating circuit 6 is provided with a P-channel MOS transistor PMT13, an N-channel MOS transistor NMT13, and a resistor R1. The reference voltage generating circuit 6 has the same circuit configuration as the trans-impedance amplifier 1 basically, with the exception that the reference voltage generating circuit 6 does not include a photodiode. The reference voltage generating circuit 6 generates a reference voltage and outputs the reference voltage from a node N14 to the comparator 5.

The comparator 5 is provided with a current source 11, P-channel MOS transistors PMT11 and PMT12, and N-channel MOS transistors NMT11 and NMT12. The N-channel MOS transistors NMT11, NMT12 constitute a differential pair. In the comparator 5, a signal i.e. a signal of a node N3, which is output from the trans-impedance amplifier 1, is inputs to a gate of the N-channel MOS transistor NMT11. In the comparator 5, the reference voltage i.e. a signal of the node N14, which is output from the reference voltage generating circuit 6, is inputs to a gate of the N-channel MOS transistor NMT12. The comparator 5 outputs an amplified comparison signal to the output circuit 7.

The output circuit 7 is provided with P-channel MOS transistors PMT14 and PMT15, and N-channel MOS transistors NMT14 and NMT15. In the output circuit 7, the outputs of the comparator 5 i.e. signals of a node N11 and a node N13 are provided respectively to the P-channel MOS transistors PMT14, PMT15 constituting a current mirror circuit. The N-channel MOS transistors NMT14, constitute a current mirror circuit through which a current Id flows to a power supply line Vss. The output circuit 7 outputs an output signal Sout from a node N16 to the output terminal Pado.

In the light receiving circuit 100, in order that the output signal Sout becomes the "Low" level when an optical signal is not input to the photodiode 3, an output voltage of the reference voltage generating circuit 6 is set to be higher than an output voltage of the trans-impedance amplifier 1 to be obtained when an optical signal is not input. Specifically, a current I4, and a gate width W/a gate length L respectively of the N-channel MOS transistor NMT13 are set to satisfy the relation.

In the light receiving circuit 100 according to the comparative example, when an optical signal is input to the photodiode 3, the output voltage of the trans-impedance amplifier 1 increases, and a voltage difference between inputs of the comparator 5 is inverted so that the output signal Sout is switched to the "High" level.

Assuming a current flowing through a drain of a P-channel MOS transistor PMT13 is denoted by I4, a current flowing through the current source 11 is denoted by Ic, and a current flowing through the N-channel MOS transistors NM14 and NM15 is denoted by Id, a current Is1$a$ of the light receiving circuit 100, which flows when an optical signal is not input to the photodiode 3, is expressed as follows. In addition, a current Is2$a$ of the light receiving circuit 100, which flows when an optical signal is input to the photodiode 3 so as to switch the level of the output signal Sout, is expressed as follows.

$$Is1a = I0 + I1 + Ic + I4 + Id \quad (14)$$

$$Is2a = I0 + I1 + Ic + I4 \quad (15)$$

Currents flowing through the light receiving circuits 90, 100 will be described below. In the following description, it is assumed that the currents I1, I0 flowing through the P-channel MOS transistors PMT1, PMT20 are set to be the same value in the respective circuits 90, 100. Also, it is assumed that the current I2, which flows through the N-channel MOS transistor NMT2 of the embodiment when a signal is not input, is set to 70% of the value.

Figure 3A:
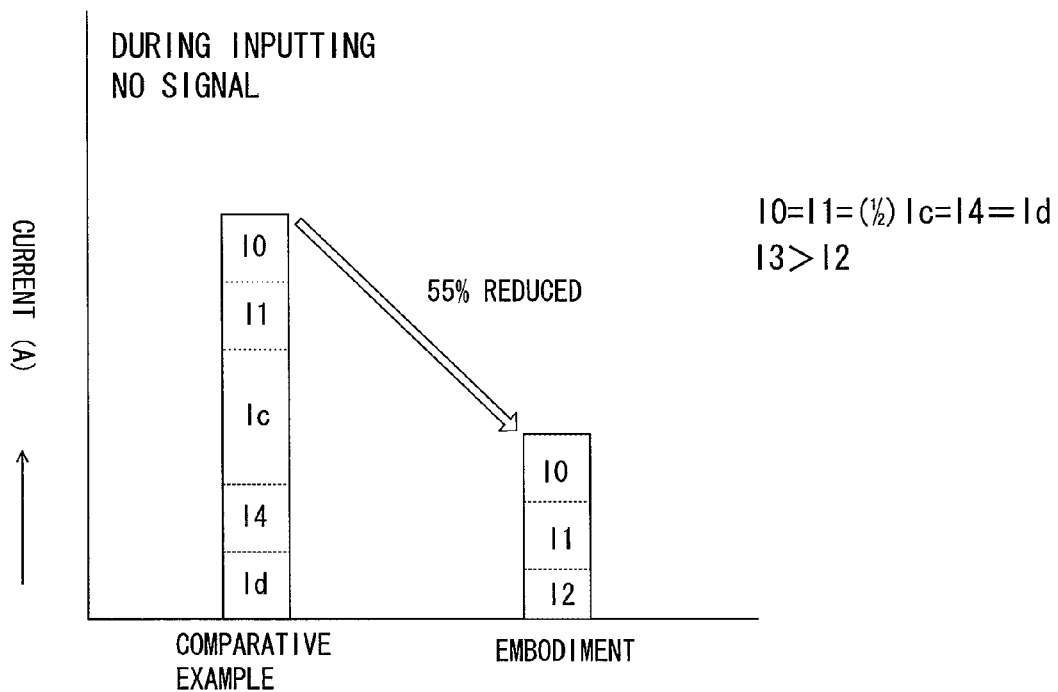
FIGS. 3A and 3B are diagrams to explain a current flowing through the light receiving circuit according to the first embodiment.
Figure 3B:
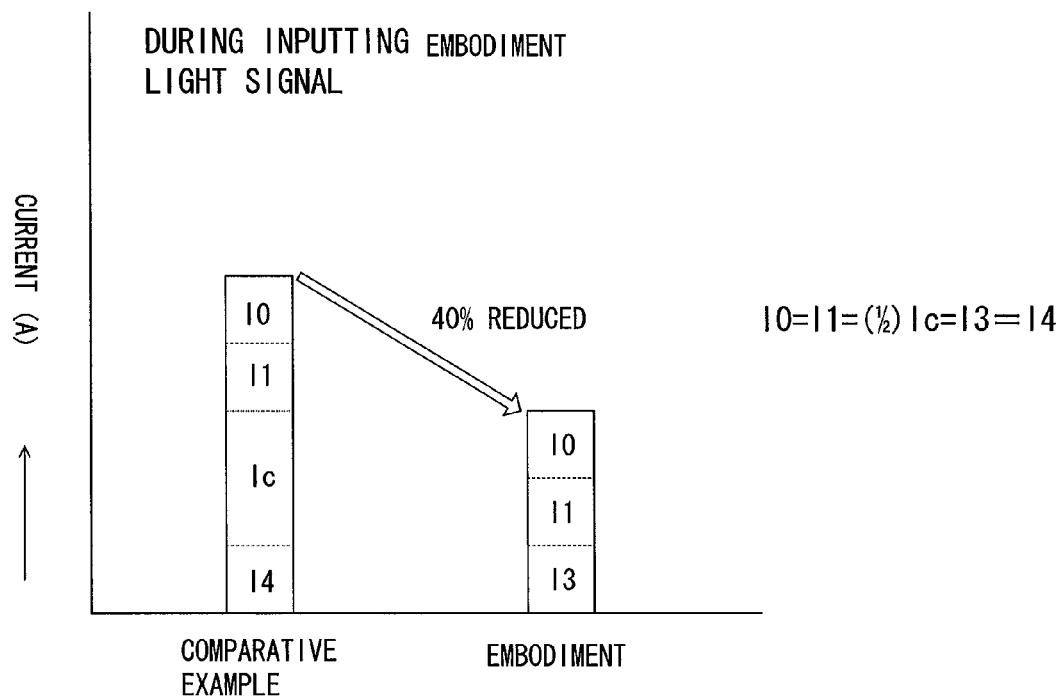

FIG. 3A illustrates a current flowing through the light receiving circuits 90, 100 when a signal is not input. FIG. 3B illustrates a current flowing through the light receiving circuits 90, 100 when a signal is input.

As illustrated in FIG. 3A, when an optical signal is not input to the photodiode 3, the light receiving circuit 90 of the embodiment can reduce the value of the current of the circuit 90 i.e. the power consumption of the circuit 90, by 55%, as compared with that of the light receiving circuit 100 of the comparative example. It is assumed that the voltage of the power supply line Vdd is 3.3 V, and that a 50 μA current flows through the MOS transistors of the respective circuits. Also, it is assumed that a current, which flows through the N-channel MOS transistor NMT2 of the embodiment when an optical signal is not input, is 35 μA (=50×0.7 μA). In this case, the current Is1 flowing through the light receiving circuit 90 of the embodiment is 135 μA. The current Is1$a$ flowing through the light receiving circuit 100 is 300 μA, assuming that the same current of 50 μA flows through the N-channel MOS transistors NMT1, NMT2.

As illustrated in FIG. 3B, when an optical signal is input to the photodiode 3, the light receiving circuit 90 of the embodiment can reduce the value of the current of the circuit 90 i.e. the power consumption, by 40%, as compared with that of the light receiving circuit 100 of the comparative example. It is assumed that the voltage of the power supply line Vdd is 3.3 V and that a 50 μA current flows through the P-channel MOS transistors PMT1, PMT20 of the respective circuits 90, 100. In this case, the current Is2 which flows through the light receiving circuit 90 of the embodiment is 150 μA. The current Is2$a$ which flows through the light receiving circuit 100 of the comparative example is 250 μA.

As described above, the light receiving circuit of the embodiment is not provided with a comparator, a reference voltage generating circuit.

Accordingly, the circuit configuration of the light receiving circuit 90 can be simplified, and the value of the current i.e. the power consumption can be reduced. As a result, it is possible to make an electronic device which is provided with the light receiving circuit 90 low power consumption.

In the light receiving circuit 90 of the embodiment, P-channel MOS transistors PMT1, PMT2 are used as a current generating unit, and N-channel MOS transistors NMT1, NMT2 are used as amplifying transistors, but the invention is not limited to the configurations. For example, as shown in a light receiving circuit 200 of a modified example illustrated in FIG. 6, N-channel MOS transistors NMT1, NMT2 may be used as transistors of a current generating unit, and P-channel MOS transistors PMT1, PMT2 may be used as amplifying transistors.

Figure 6:
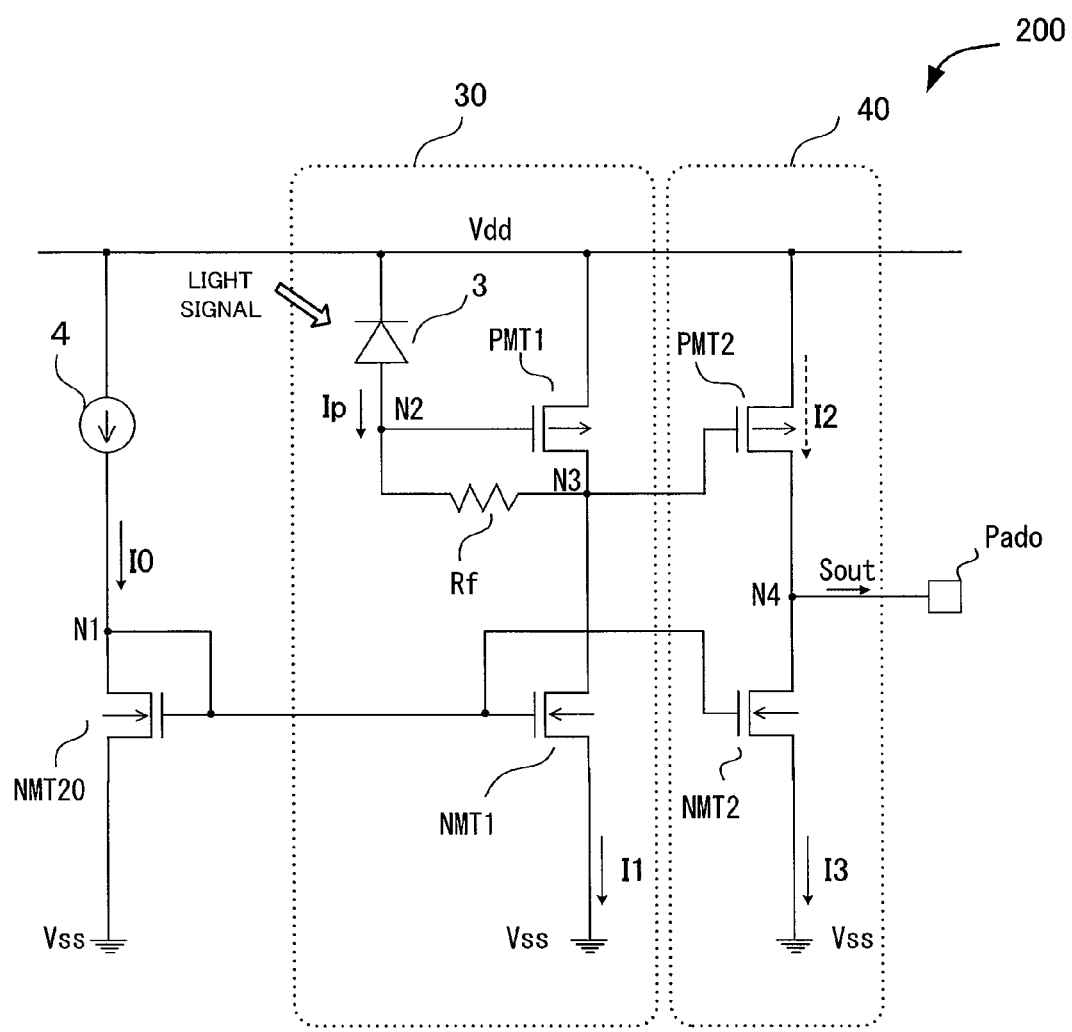
FIG. 6 is a circuit diagram illustrating a modified example of the light receiving circuit according to the first embodiment.

Specifically, in FIG. 6, the light receiving circuit 200 is provided with a current source 4, a trans-impedance amplifier 30, an output circuit 40, an N-channel MOS transistor NMT20, and an output terminal Pado. The trans-impedance amplifier 30 includes a photodiode 3, a P-channel MOS transistor PMT1, an N-channel MOS transistor NMT1, and a feedback resistor Rf. The output circuit 40 includes a P-channel MOS transistor PMT2 and an N-channel MOS transistor NMT2.

A cathode and an anode of the photodiode 3 are connected respectively to a power supply line Vdd and a node N2. A drain of the P-channel MOS transistor PMT1 and a drain of the N-channel MOS transistor NMT1 are connected to a node N3. Terminals of the feedback resistor Rf are connected to the node N2 and the node N3. The node N2 is connected to a gate of the P-channel MOS transistor PMT1. A gate of the N-channel MOS transistor NMT1 is connected to a gate of the N-channel MOS transistor NMT2. An electrical signal converted photoelectrically by the photodiode 3 is input to a gate of the P-channel MOS transistor PMT1. The node N3 is connected to a gate of the P-channel MOS transistor PMT2, and an output signal i.e. a signal of the node N3 of the trans-impedance amplifier 30 is input to the gate of the P-channel MOS transistor PMT2. As a result, an output signal Sout is output from the drain i.e. a node N4 of the P-channel MOS transistor PMT2.

In the first embodiment, the trans-impedance amplifier 1 uses one piece of feedback resistor Rf, but the invention is not limited to the configuration. The trans-impedance amplifier may include a plurality of feedback resistors connected in series.

Figure 4:
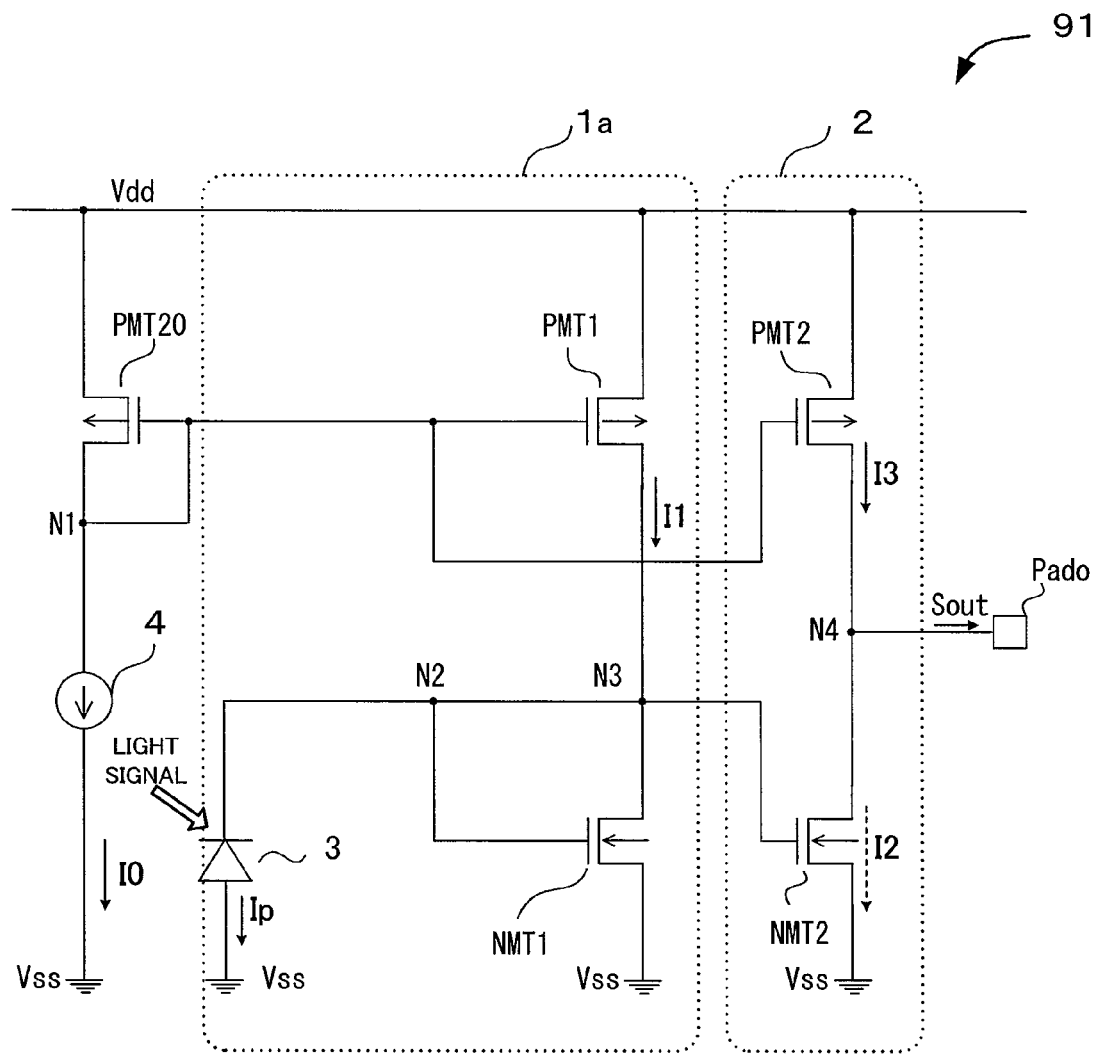
FIG. 4 is a circuit diagram illustrating a configuration of a light receiving circuit according to a second embodiment.

A light receiving circuit according to a second embodiment will be described with reference to FIG. 4. FIG. 4 is a circuit diagram illustrating a configuration of the light receiving circuit. In the embodiment, a feedback resistor is not used.

As illustrated in FIG. 4, a light receiving circuit 91 is provided with a light receiver 1a, an output circuit 2, a current source 4, a P-channel MOS transistor PMT20, and an output terminal Pado.

The light receiving circuit 91 includes a plurality of CMOSs. The light receiving circuit 91 may used in a photocoupler as an optical coupling circuit, a light receiving device of an optical fiber link, etc. The light receiving circuit 91 is a light receiving circuit with a buffer logic configuration.

The light receiver 1a is provided with a photodiode 3, a P-channel MOS transistor PMT1, and an N-channel MOS transistor NMT1. The output circuit 2 includes a P-channel MOS transistor PMT2 and an N-channel MOS transistor NMT2.

A drain i.e. a first terminal of the N-channel MOS transistor NMT1 is connected to a node N3 i.e. an internal output terminal, and the gate i.e. a control terminal of the N-channel MOS transistor NMT1 is connected to the node N2 and a cathode of the photodiode 3. A source i.e. a second terminal of the N-channel MOS transistor NMT1 is connected to a power supply line Vss. A gate of the P-channel MOS transistor PMT1 is connected to a gate of the P-channel MOS transistor PMT2. The node N2 and a node N3 are shorted. A voltage of a node N1 is supplied to the gate of the P-channel MOS transistor PMT2, and a signal of the node N3 is provided to a gate of the N-channel MOS transistor NMT2. A node N4 is connected to the output terminal Pado, and a signal of the node N4 is provided to the output terminal Pado.

In the light receiving circuit 91, currents I1, I3, a gate width W1/a gate length L1 respectively of the N-channel MOS transistor NMT1, and a gate width W2/a gate length L2 respectively of the N-channel MOS transistor NMT2 are set to suitable values. When an optical signal is not input to the photodiode 3, the values are set such that the current I2 is larger than the current I3 (I2>I3).

In this case, since the currents I2, I3 are set to I2>I3 and the N-channel MOS transistor NMT2 operates in a linear region, an output signal Sout becomes a "Low" level. At this time, the current I3 flows through the N-channel MOS transistor NMT2.

In the light receiving circuit 91, when an optical signal is input to the photodiode 3, a current flowing through the N-channel MOS transistor NMT1 is equal to the value obtained by subtracting a current Ip from the current I1. In the case, the current I2, which flows through the N-channel MOS transistor NMT2 constituting a current mirror circuit in conjunction with the N-channel MOS transistor NMT1, also becomes smaller (I2<I3). The P-channel MOS transistor PMT2 operates in a linear region so that the output signal Sout becomes a "High" level. At this time, the current I2 flows through the P-channel MOS transistor PMT2.

A current Is1b, which flows through the light receiving circuit 91 when an optical signal is not input to the photodiode 3, is expressed as follows. In addition, a current Is2b, which flows through the light receiving circuit 91 when an optical signal is input to the photodiode 3 to switch the output signal Sout to the "High" level, is expressed as follows.

$$Is1b = I0 + I1 + I3 \quad (16)$$

$$Is2b = I0 + I1 + I2 \quad (17)$$

As the first embodiment, the light receiving circuit 91 of the embodiment can reduce the value of the current of the circuit 91 i.e. the power consumption, as compared with the light receiving circuit 100 of the comparative example.

A switching current Ipth obtained from an optical current of the photodiode 3 will be described below.

Assuming a threshold voltage of the N-channel MOS transistors NMT1 and NMT2 is denoted by Vt, a voltage of the node N2 is denoted by V1, the gate width/the gate length respectively of the N-channel MOS transistor NMT1 is denoted by W1/L1, the gate width/the gate length respectively of the N-channel MOS transistor NMT2 is denoted by W2/L2, and a proportional multiplier is denoted by K', the voltage V1 can be expressed as follows.

$$V_1 = V_T + \sqrt{\frac{2(I_1 - I_P)}{(W_1/L_1)K'}} \quad (4)$$

The current I2 can be expressed as follows.

$$I_2 = \left(\frac{1}{2}\right)(W_2/L_2)K'(V_1 - V_T)^2 \quad (5)$$
$$= \frac{(W_2/L_2)(I_1 - I_P)}{(W_1/L_1)}$$

When a threshold current Ipth is a current Ip flowing when the current I2 is equal to the current I3, the threshold current Ipth can be expressed as follows.

$$I_{pTH} = I_1 - \frac{(W_1/L_1)}{(W_2/L_2)}(I_3) \quad (6)$$

As described above, the light receiving circuit 91 of the embodiment does not include a comparator and a reference voltage generating circuit.

Accordingly, the circuit configuration of the light receiving circuit 91 can be simplified, and the value of the current of the circuit 91 i.e. the power consumption can be reduced. As a result, it is possible to make an electronic device including the light receiving circuit 91 low power consumption.

Figure 5:
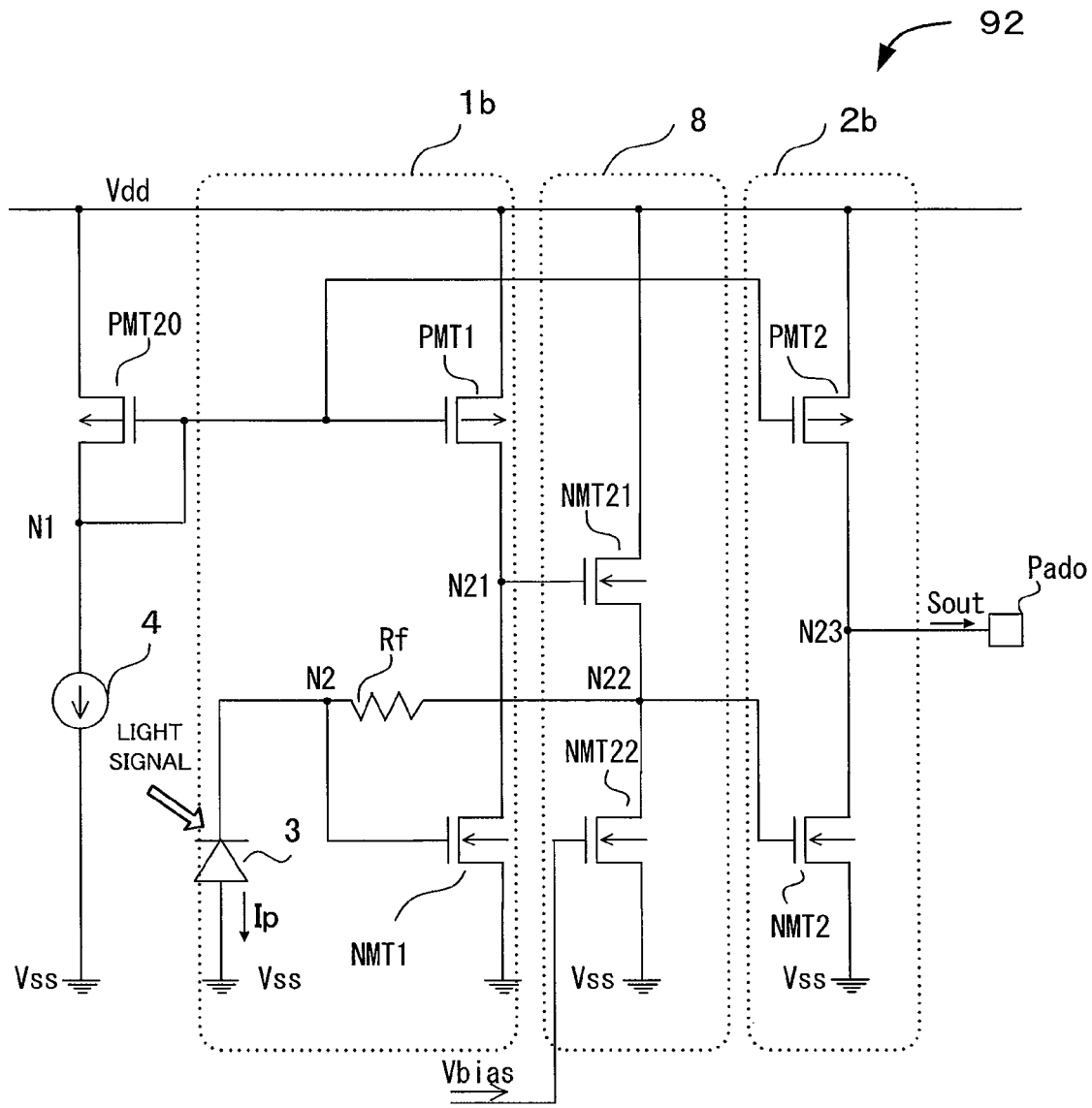
FIG. 5 is a circuit diagram illustrating a configuration of a light receiving circuit according to a third embodiment.

A light receiving circuit according to a third embodiment will be described with reference to FIG. 5. FIG. 5 is a circuit diagram illustrating a configuration of the light receiving circuit. In the embodiment, a source follower circuit is provided between a trans-impedance amplifier and an output circuit.

As illustrated in FIG. 5, a light receiving circuit 92 is provide with a trans-impedance amplifier 1b, a source follower circuit 8, an output circuit 2b, a current source 4, a P-channel MOS transistor PMT20, and an output terminal Pado.

The light receiving circuit 92 includes a plurality of CMOS devices. The light receiving circuit 90 may used in a photocoupler as an optical coupling circuit, a light receiving device of an optical fiber link etc.

Similar to the first embodiment illustrated in FIG. 1, the trans-impedance amplifier 1b is provided with a photodiode 3, a P-channel MOS transistor PMT1, an N-channel MOS transistor NMT1, and a feedback resistor Rf. The source follower circuit 8 includes N-channel MOS transistors NMT21 and NMT22.

One end of the feedback resistor Rf is connected to the anode of the photodiode 3 through a node N2, and the other end of the feedback resistor Rf is connected to a node N22 of the source follower circuit 8. A source i.e. a first terminal of the P-channel MOS transistor PMT1 is connected to a power supply line Vdd. A gate i.e. a control terminal of the P-channel MOS transistor PMT1 is connected to a gate of the P-channel MOS transistor PMT20. A drain i.e. a second terminal of the P-channel MOS transistor PMT1 is connected to a node N21.

A drain i.e. a first terminal of the N-channel MOS transistor NMT1 is connected to the node N21. A gate i.e. a control terminal of the N-channel MOS transistor NMT1 is connected to a cathode of the photodiode 3 through the node N2. A source i.e. a second terminal of the N-channel MOS transistor NMT1 is connected to a power supply line Vss.

A drain i.e. a first terminal of the N-channel MOS transistor NMT21 is connected to a power supply line Vdd. A gate i.e. a control terminal of the N-channel MOS transistor NMT21 is connected to the node 21. A source i.e. a second terminal of the N-channel MOS transistor NMT21 is connected to a node N22.

A drain i.e. a first terminal of the N-channel MOS transistor NMT22 is connected to the node N22. A bias voltage Vbias is applied to a gate i.e. a control terminal of the N-channel MOS transistor NMT22. A source i.e. a second terminal of the N-channel MOS transistor NMT22 is connected to the power supply line Vss. The N-channel MOS transistor NMT22 operates as a constant current source when a bias voltage Vbias is provided to the gate of the N-channel MOS transistor NMT22.

The output circuit 2b includes a P-channel MOS transistor PMT2 and an N-channel MOS transistor NMT2.

A source i.e. a first terminal of the P-channel MOS transistor PMT2 is connected to the power supply line Vdd. A gate i.e. a control terminal of the P-channel MOS transistor PMT2 is connected to a gate of the P-channel MOS transistor PMT20. A drain i.e. a second terminal of the P-channel MOS transistor PMT2 is connected to a node N23.

A drain i.e. a first terminal of the N-channel MOS transistor NMT2 is connected to the node N23. A gate i.e. a control terminal of the N-channel MOS transistor NMT2 is connected to the node N22. A source i.e. a second terminal of the N-channel MOS transistor NMT2 is connected to the power supply line Vss.

A voltage of the node N1 is provided to the gate of the P-channel MOS transistor PMT2. A signal of the node N22 is provided to the gate of the N-channel MOS transistor NMT2. The node N23 is connected to the output terminal Pado. A signal of the node N23 is provided to the output terminal Pado.

As described above, in the light receiving circuit 92, the source follower circuit 8 is used to output from the node N22 a signal which is produced at a drain of the P-channel MOS transistor PMT1 as a current generating unit.

The use of the source follower circuit 8 can increase an open-loop gain, and improves frequency characteristics.

As described above, the light receiving circuit 92 of the embodiment includes the source follower circuit 8. The configuration of the light receiving circuit 92 is simple because the light receiving circuit 92 does not include a comparator and a reference voltage generating circuit.

Each of the light receiving circuits of the above embodiments is configured by a plurality of MOS transistors. The gate insulating layer of each MOS transistors is composed of a silicon oxide ($SiO_2$) film. Instead of each of the MOS transistors, a metal insulator semiconductor (MIS) transistor may be used as an insulating gate field effect transistor. The gate insulating film of the MIS transistor is composed of an insulating film such as an NO film, an ONO film, and a high-K gate insulating film such as an HfO layer.

In the light receiving circuits according to the embodiments, each of the N-channel MOS transistors may be replaced with a P-channel MOS transistor, and each of the P-channel MOS transistors may be replaced with a N-channel MOS transistor. In addition, a MOS transistor may be added so that the switching current Ipth has hysteresis. In the current mirror circuits, a PNP bipolar transistor may be used instead of each P-channel MOS transistor. In this case, the light receiving circuit has a BiCMOS configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light receiving circuit comprising:
a trans-impedance amplifier which includes a photodiode to convert an optical signal into an electrical signal, a feedback resistor, a first current generating unit, and a first N channel transistor, one end of the photodiode being connected to a power supply line of a lower potential side, one end of the feedback resistor being connected to the other end of the photodiode, one end of the first current generating unit being connected to a power supply line of a higher potential side, the other end of the first current generating unit being connected to the other end of the feedback resistor and a drain of the first N channel transistor, a gate of the first N channel transistor being connected to the other end of the photodiode, a source of the first N channel transistor being connected to the power supply line of the lower potential side;
an output circuit which includes a second current generating unit and a second N channel transistor and outputs an output signal from the drain of the second N channel transistor, one end of the second current generating unit being connected to the power supply line of the higher potential side, the other end of the second current generating unit being connected to a drain of the second N channel transistor, a gate of the second N channel transistor being connected to the drain of the first N channel transistor, a source of the second N channel transistor being connected to the lower potential side; and
a first P-channel transistor, wherein
the first current generating unit includes a second P-channel transistor, the second current generating unit includes a third P-channel transistor, a gate of the first P-channel transistor is connected to a drain of the first P-channel transistor and gates of the second and the third P-channel transistors, and the first, the second and the third P-channel transistors constitute a current mirror circuit.

2. A light receiving circuit according to claim 1, wherein the photodiode is a silicon photodiode.

3. A light receiving circuit according to claim 1, further comprising a current source connected to the drain of the first P-channel transistor and the power supply line of the lower potential side.

4. A light receiving circuit according to claim 1, wherein each of the first and the second current generating units includes a bipolar transistor.

5. A light receiving circuit comprising:

a light receiver which includes a photodiode to convert an optical signal into an electrical signal, a first current generating unit, and a first N-channel transistor, an anode of the photodiode being connected to a power supply line of a lower potential side, one end of the first current generating unit being connected to a power supply line of a higher potential side, the other end of the first current generating unit being connected to a drain of the first N-channel transistor, a gate of the first N-channel transistor being connected to the drain of the first N-channel transistor and a cathode of the photodiode, a source of the first N-channel transistor being connected to the lower potential side;

an output circuit which includes a second current generating unit and a second N-channel transistor and outputs an output signal from the drain of the second transistor, one end of the second current generating unit being connected to the higher potential side, the other end of the second current generating unit being connected to a drain of the second N-channel transistor, a gate of the second N-channel transistor being connected to the drain of the first N-channel MOS transistor, a source of the second N-channel transistor being connected to the lower potential side, an output signal being output from the drain of the second N-channel transistor; and a first P-channel transistor, wherein the first current generating unit includes a second P-channel transistor, the second current generating unit includes a third P-channel transistor, a gate of the first P-channel transistor is connected to a drain of the first P-channel transistor and gates of the second and the third P-channel transistors, and the first, the second and the third P-channel transistors constitute a current mirror circuit.

6. A light receiving circuit according to claim 5, wherein the photodiode is a silicon photodiode.

7. A light receiving circuit according to claim 5, further comprising a current source connected to the drain of the first P-channel transistor and the power supply line of the lower potential side.

8. A light receiving circuit according to claim 5, wherein each of the first and the second current generating units includes a bipolar transistor.

* * * * *